US012628608B2

(12) United States Patent
Hisada et al.

(10) Patent No.: US 12,628,608 B2
(45) Date of Patent: May 12, 2026

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Taku Hisada, Toyama (JP); Tsukasa Yashima, Toyama (JP); Shin Tsujimura, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 421 days.

(21) Appl. No.: 18/315,708

(22) Filed: May 11, 2023

(65) Prior Publication Data
US 2023/0369085 A1 Nov. 16, 2023

(30) Foreign Application Priority Data

May 13, 2022 (JP) ................................. 2022-079683

(51) Int. Cl.
*H01L 21/67* (2006.01)
*G05B 19/4099* (2006.01)
*H01L 21/687* (2006.01)

(52) U.S. Cl.
CPC .... *H01L 21/67248* (2013.01); *G05B 19/4099* (2013.01); *H01L 21/68764* (2013.01); *G05B 2219/45031* (2013.01)

(58) Field of Classification Search
CPC ...... G05B 19/4099; G05B 2219/45031; H01L 21/67103; H01L 21/67109;
(Continued)

(56) References Cited

U.S. PATENT DOCUMENTS 5,980,194 A * 11/1999 Freerks ................... H01L 21/68
414/754
2006/0278701 A1 12/2006 Matsushita et al.
(Continued)

FOREIGN PATENT DOCUMENTS

JP 2002-134424 A 5/2002
JP 2002-299269 A 10/2002
(Continued)

OTHER PUBLICATIONS

Notice of Reasons for Refusal with English translation in Japanese Application No. 2022-079683, dated Apr. 12, 2024, 8 pages.
(Continued)

*Primary Examiner* — Kidest Worku
(74) *Attorney, Agent, or Firm* — Edell, Shapiro & Finnan, LLC

(57) ABSTRACT

According to the present disclosure, there is provided a technique capable of substantially uniformizing the quality of each substrate by setting the position of the substrate in accordance with the process conditions for each step of the substrate processing. According to one aspect thereof, there is provided a substrate processing apparatus including: a support structure capable of supporting at least a substrate; and a controller provided with a memory in which a recipe capable of setting a support position of the substrate is stored, wherein the controller is configured to be capable of controlling an operation of elevating and lowering the support structure such that the support position set in the recipe is located at a predetermined reference position.

17 Claims, 9 Drawing Sheets

(58) Field of Classification Search
CPC ......... H01L 21/67248; H01L 21/68742; H01L
21/68764; H01L 21/68792
See application file for complete search history.

(56) References Cited

U.S. PATENT DOCUMENTS

| | | | |
|---|---|---|---|
| 2007/0006806 A1 | 1/2007 | Imai | |
| 2007/0074660 A1 | 4/2007 | Park et al. | |
| 2012/0065763 A1 | 3/2012 | Asai | |
| 2013/0065189 A1 | 3/2013 | Yoshii et al. | |
| 2016/0093519 A1* | 3/2016 | Higashi ............. | H01L 21/67109 |
| | | | 219/444.1 |
| 2017/0186634 A1* | 6/2017 | Yanagisawa ...... | H01J 37/32009 |
| 2018/0211840 A1 | 7/2018 | Yamaguchi et al. | |
| 2019/0006218 A1* | 1/2019 | Toyoda ............. | H01L 21/67745 |
| 2019/0189490 A1 | 6/2019 | Morita et al. | |
| 2019/0295854 A1* | 9/2019 | Kamakura ............. | H10B 43/27 |
| 2022/0005738 A1 | 1/2022 | Tateno et al. | |

FOREIGN PATENT DOCUMENTS

| | | | |
|---|---|---|---|
| JP | 2005-159317 | A | 6/2005 |
| JP | 2006-344112 | A | 12/2006 |
| JP | 2010-166075 | A | 7/2010 |
| JP | 2012-60059 | A | 3/2012 |
| JP | 2012-099711 | A | 5/2012 |
| JP | 2013-62361 | A | 4/2013 |
| JP | 2019-114784 | A | 7/2019 |
| KR | 10-2019-0074995 | A | 6/2019 |
| WO | 2004/086496 | A1 | 10/2004 |
| WO | 2016/098887 | A1 | 6/2016 |
| WO | 2016/111352 | A1 | 7/2016 |
| WO | 2017/056148 | A1 | 4/2017 |
| WO | 2020/194414 | A1 | 10/2020 |

OTHER PUBLICATIONS

Request for the Submission of an Opinion with English translation in Korean Application No. 10-2023-0060454, issued Oct. 18, 2024, 13 pages.

* cited by examiner

FIG. 5

| STEP | NO | 1 | 2 | 3 | 4 | 5 | 6 | 7 |
|---|---|---|---|---|---|---|---|---|
| STEP | NAME | STEP1 | STEP2 | STEP3 | STEP4 | STEP5 | STEP6 | STEP7 |
| | TIME | 0:00 | 1:25 | 0:15 | 5:00 | 5:00 | 3:00 | 2:00 |
| PRESS | Ctrl Mode | ... | ... | ... | ... | ... | ... | ... |
| | Set Value | ... | ... | ... | ... | ... | ... | ... |
| Boat | Ctrl Mode | Move | Meas(MAX) | Watch(Slot) | Watch(MAX) | Watch(MAX) | Watch(MAX) | Watch(Slot) |
| | Slot No | 0 | - | 5 | - | - | - | 5 |
| | Watch Temp | - | - | 200 | 150 | 100 | 50 | 30 |
| | Check Time | - | - | 0:00:00 | 0:05:00 | 0:05:00 | 0:03:00 | 0:02:00 |
| | Timeout Proc | - | - | Successful | Skip | Skip | Skip | End |
| VALVE | Valve001 Set value | ... | ... | ... | ... | ... | ... | ... |
| | Valve002 Set value | ... | ... | ... | ... | ... | ... | ... |
| | Valve003 Set value | ... | ... | ... | ... | ... | ... | ... |

FIG. 6

| CONTROL MODE | SETTING ITEMS | | | |
| --- | --- | --- | --- | --- |
| | SLOT POSITION (SUPPORT POSITION) | TARGET TEMPERATURE (MONITOR TEMPERATURE) | TARGET TIME (MONITOR TIME) | ACTION (TIME LAPSE PROCESS) |
| BOAT MOVE | O | - | - | - |
| MEASURE TEMPERATURE (MAX. TEMPERATURE) | - | - | - | - |
| MEASURE TEMPERATURE (SELECTED SLOT) | O | - | - | - |
| MONITOR TEMPERATURE (MAX. TEMPERATURE) | - | O | O | O |
| MONITOR TEMPERATURE (SELECTED SLOT) | O | O | O | O |

FIG. 8

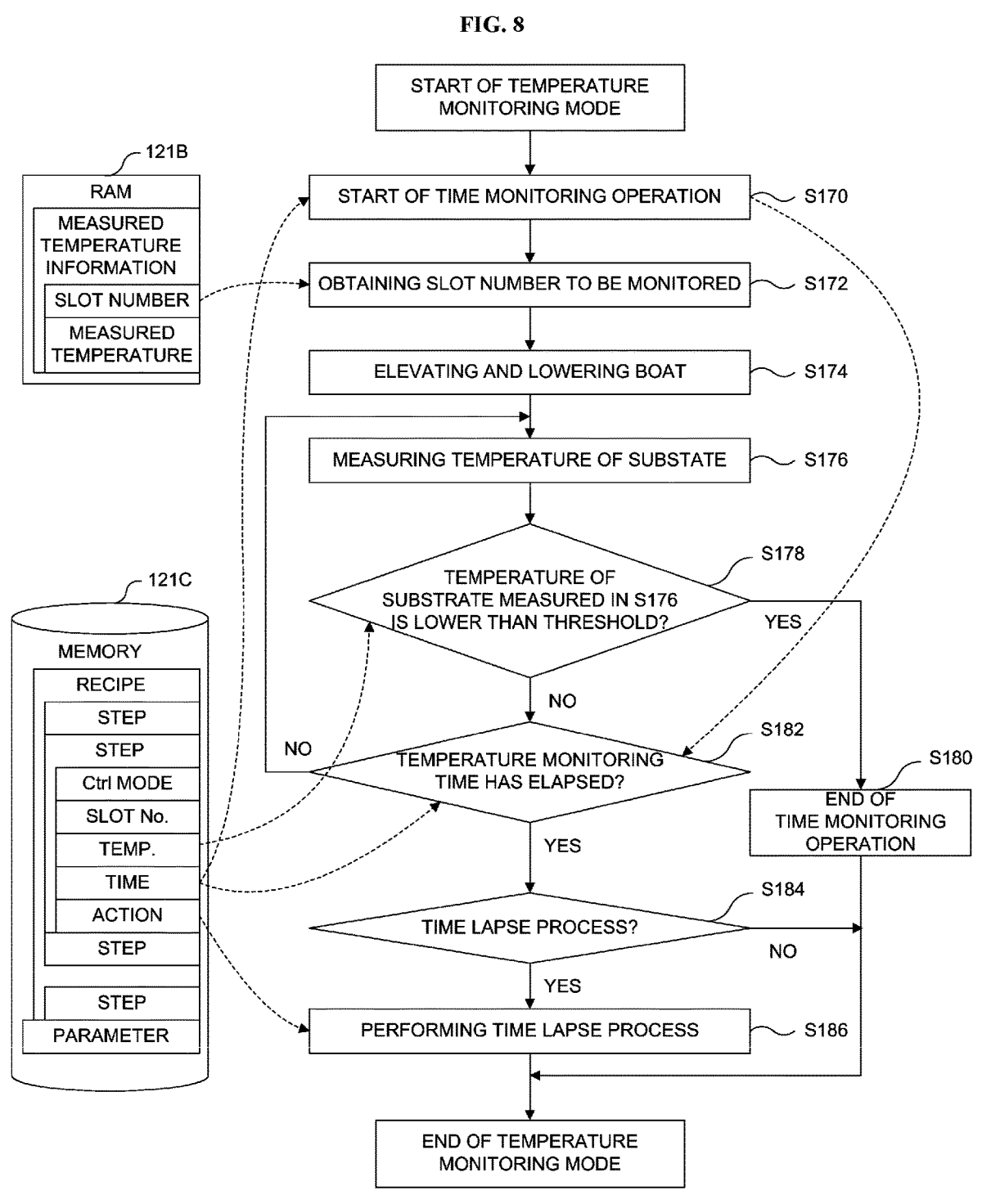

START OF TEMPERATURE
MONITORING MODE

┌─────────────────────────────────────────────┐
│ 121B                                         │
│ RAM                                          │
│ MEASURED                                     │
│ TEMPERATURE                                  │
│ INFORMATION                                  │
│ SLOT NUMBER                                  │
│ MEASURED                                     │
│ TEMPERATURE                                  │
└─────────────────────────────────────────────┘

START OF TIME MONITORING OPERATION — S170

OBTAINING SLOT NUMBER TO BE MONITORED — S172

ELEVATING AND LOWERING BOAT — S174

MEASURING TEMPERATURE OF SUBSTATE — S176

121C

MEMORY
RECIPE
STEP
STEP
Ctrl MODE
SLOT No.
TEMP.
TIME
ACTION
STEP
STEP
PARAMETER

TEMPERATURE OF
SUBSTRATE MEASURED IN S176
IS LOWER THAN THRESHOLD? — S178

YES

NO

TEMPERATURE MONITORING
TIME HAS ELAPSED? — S182

NO

END OF
TIME MONITORING
OPERATION — S180

YES

TIME LAPSE PROCESS? — S184

NO

YES

PERFORMING TIME LAPSE PROCESS — S186

END OF TEMPERATURE
MONITORING MODE

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS REFERENCE TO RELATED APPLICATIONS

This application claims foreign priority under 35 U.S.C. § 119(a)-(d) to Application No. JP 2022-079683 filed on May 13, 2022, the entire contents of which are hereby incorporated by reference.

TECHNICAL FIELD

The present disclosure relates to a substrate processing apparatus, a method of manufacturing a semiconductor device and a non-transitory computer-readable recording medium.

BACKGROUND

Conventionally, a substrate processing apparatus provided with a load lock chamber may be used. A substrate may be transferred (loaded) into the load lock chamber or transferred (unloaded) from the load lock chamber. According to some related arts, the load lock chamber of the substrate processing apparatus is provided with a function of switching an inner atmosphere of the load lock chamber between an atmospheric state and a vacuum state.

By the way, in the substrate processing apparatus, when performing a recipe for processing the substrate, a plurality of steps may be performed while a position of the substrate is fixed.

SUMMARY

According to the present disclosure, there is provided a technique capable of substantially uniformizing a quality of a substrate by setting a position of a substrate suitable for process conditions for each step of a substrate processing.

According to an aspect of the technique of the present disclosure, there is provided a substrate processing apparatus including: a support structure capable of supporting at least a substrate; and a controller provided with a memory in which a recipe capable of setting a support position of the substrate is stored, wherein the controller is configured to be capable of controlling an operation of elevating and lowering the support structure such that the support position set in the recipe is located at a predetermined reference position.

BRIEF DESCRIPTION OF THE DRAWINGS

FIG. 5 is a diagram schematically illustrating an exemplary setting of a recipe step of the substrate processing apparatus according to the embodiments of the present disclosure.

FIG. 6 is a diagram schematically illustrating a control mode for a substrate support in the recipe step shown in FIG. 5.

FIG. 8 is a flow chart schematically illustrating a flow of a temperature monitoring mode of the substrate processing apparatus according to the embodiments of the present disclosure.

DETAILED DESCRIPTION

Embodiments of Present Disclosure

Figure 1:
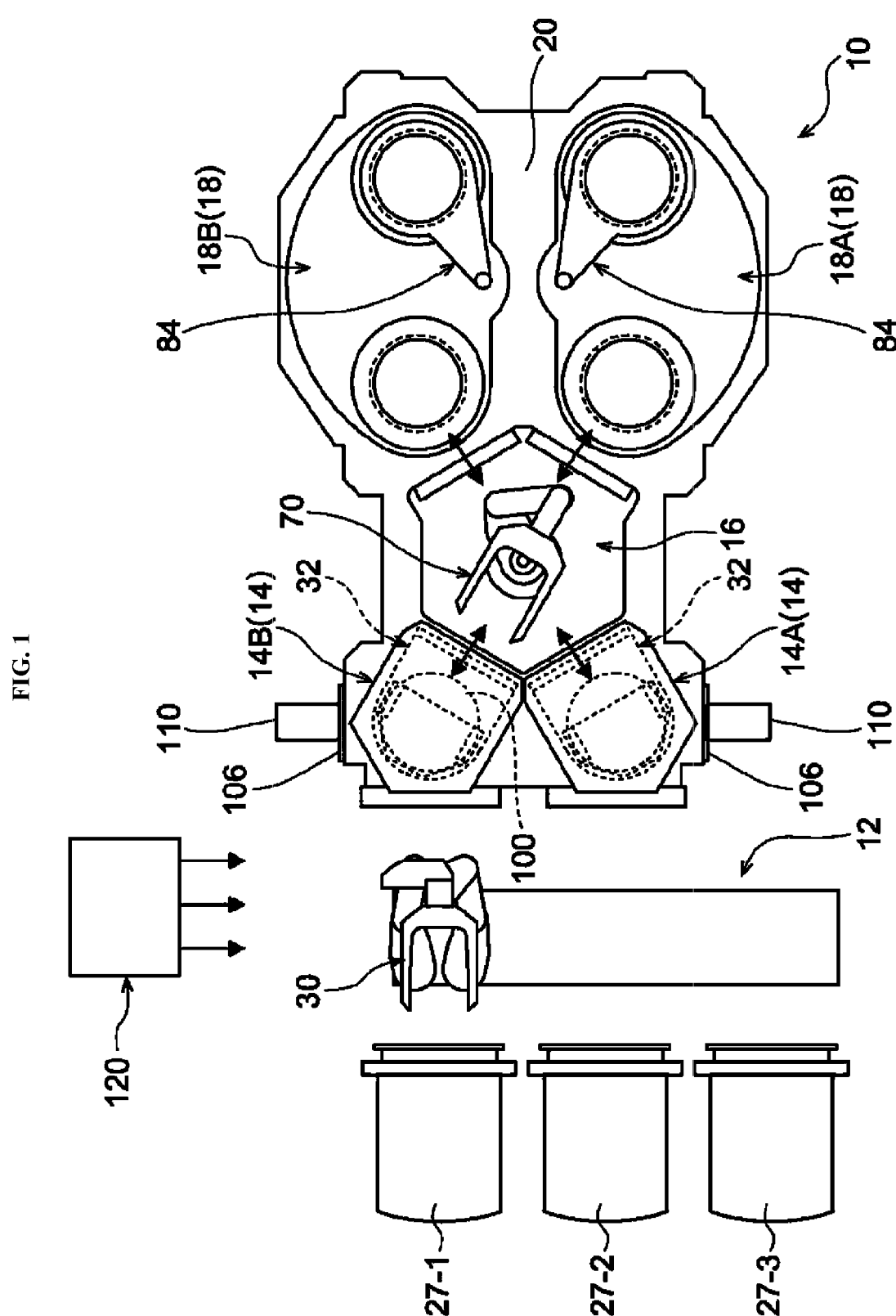
FIG. 1 is a diagram schematically illustrating a configuration of a substrate processing apparatus according to one or more embodiments of the present disclosure.

Hereinafter, one or more embodiments (also simply referred to as "embodiments") of the technique of the present disclosure will be described in detail mainly with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

Figure 2:
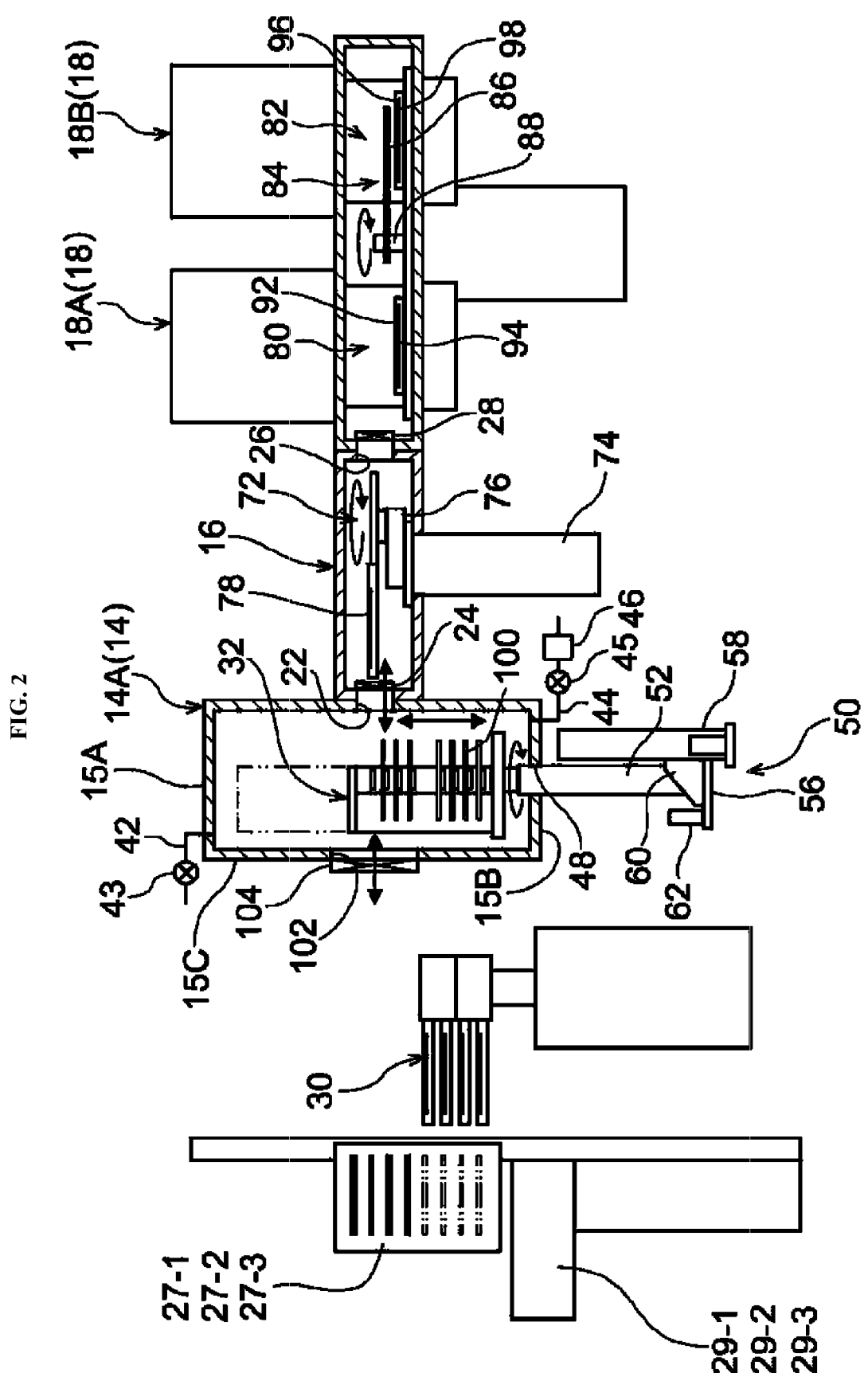
FIG. 2 is a diagram schematically illustrating a vertical cross-section of the substrate processing apparatus according to the embodiments of the present disclosure.

As shown in FIGS. 1 and 2, a substrate processing apparatus 10 according to the present embodiments may include: an atmospheric transfer chamber (EFEM: Equipment Front End Module) 12; loading port structures 29-1 through 29-3 connected to the atmospheric transfer chamber 12 and serving as mounting structures on which pods (which are substrate storage containers) 27-1 through 27-3 are placed, respectively; load lock chambers 14A and 14B serving as pressure-controlled preliminary chambers; a transfer chamber 16 serving as a vacuum transfer chamber; and process chambers 18A and 18B in which a plurality of substrates including a substrate 100 are processed. Hereinafter, the plurality of substrates including the substrate 100 may also be referred to as "substrates 100". For example, a partition wall (which is a boundary wall) 20 is provided to separate the process chamber 18A from the process chamber 18B. According to the present embodiments, a semiconductor wafer such as a silicon wafer on which a semiconductor device is manufactured may be used as the substrate 100.

According to the present embodiments, configurations of the load lock chambers 14A and 14B (including components associated with the load lock chambers 14A and 14B) are substantially the same. Therefore, in the present specification, the load lock chambers 14A and 14B may be collectively or individually referred to as a "load lock chamber 14". Further, the load lock chamber 14 of the present embodiments is an example of a vessel (or a container) in the present disclosure.

According to the present embodiments, configurations of the process chambers 18A and 18B (including components associated with the process chambers 18A and 18B) are substantially the same. Therefore, in the present specification, the process chambers 18A and 18B may be collectively or individually referred to as a "process chamber 18".

As shown in FIG. 2, a communication structure 22 is provided between the load lock chamber 14 and the transfer chamber 16 so as to communicate between adjacent chambers (that is, the load lock chamber 14 and the transfer chamber 16). For example, the communication structure 22 is configured to be opened or closed by a gate valve 24.

As shown in FIG. 2, a communication structure 26 is provided between the transfer chamber 16 and the process chamber 18 so as to communicate between adjacent chambers (that is, the transfer chamber 16 and the process chamber 18). For example, the communication structure 26 is configured to be opened or closed by a gate valve 28.

An atmospheric robot 30 serving as an atmospheric transfer structure is provided in the atmospheric transfer chamber 12. The atmospheric robot 30 is capable of transferring the substrate 100 between the load lock chamber 14 and each of the pods 27-1 through 27-3 placed on the loading port structures 29-1 through 29-3, respectively. The atmospheric robot 30 is configured to be capable of simultaneously transferring two or more substrates among the substrates 100 in an atmospheric state (that is, under an atmospheric pressure).

An unprocessed substrate among the substrates 100 may be transferred (loaded) into the load lock chamber 14 or transferred (unloaded) from the load lock chamber 14. Hereinafter, the unprocessed substrate among the substrates 100 may also be simply referred to as an "unprocessed substrate 100". Specifically, the unprocessed substrate 100 is loaded into the load lock chamber 14 by the atmospheric robot 30, and the unprocessed substrate 100 loaded into the load lock chamber 14 is unloaded from the load lock chamber 14 by a vacuum robot 70 described later. On the other hand, a processed substrate among the substrates 100 is loaded into the load lock chamber 14 by the vacuum robot 70. Hereinafter, the processed substrate among the substrates 100 may also be simply referred to as a "processed substrate 100". The processed substrate 100 loaded into the load lock chamber 14 is unloaded from the load lock chamber 14 by the atmospheric robot 30. In the present specification, the atmospheric robot 30 and the vacuum robot 70, which are capable of transferring the substrate 100, may be collectively or individually referred to as a "transfer robot".

Figure 3:
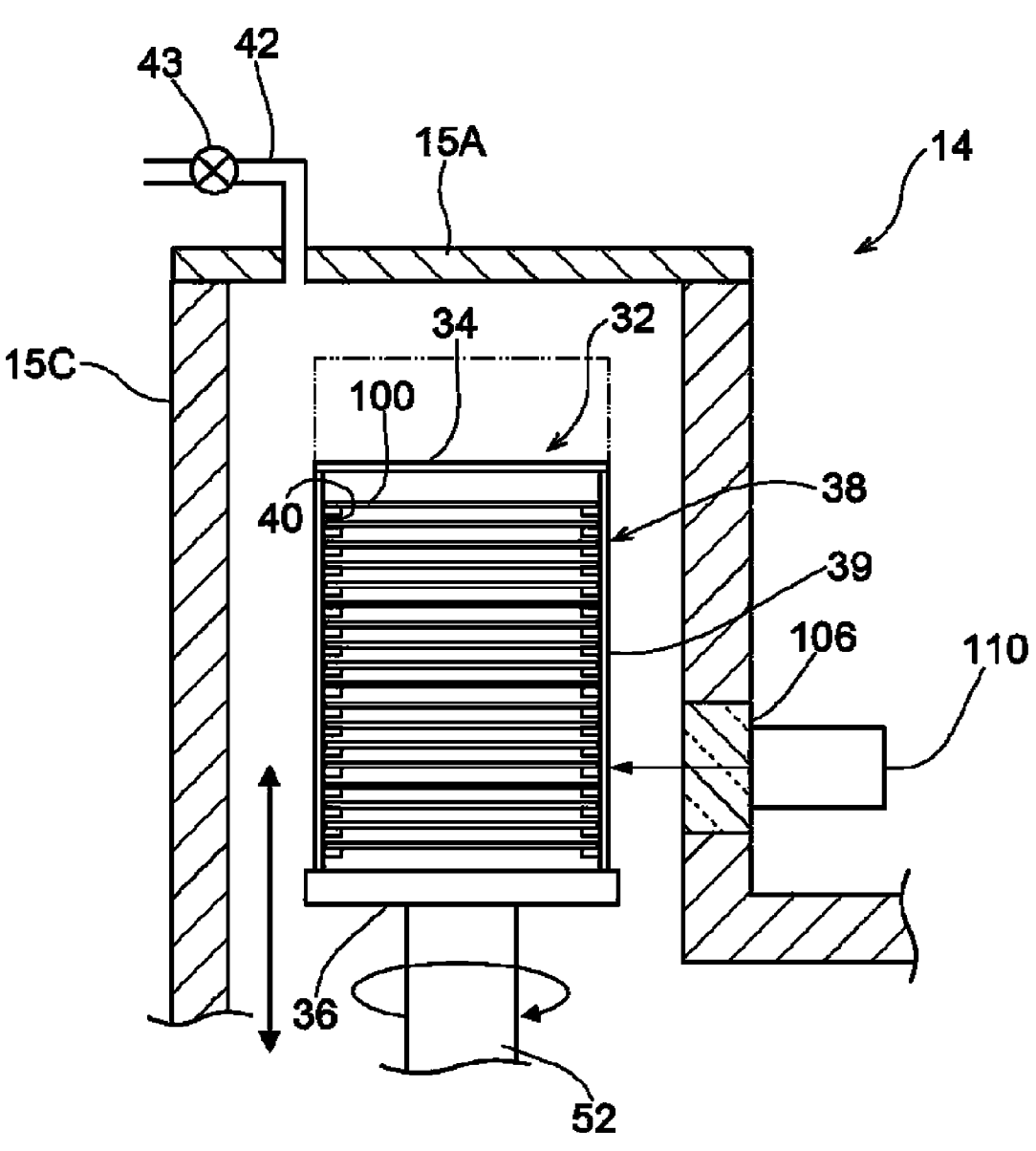
FIG. 3 is a diagram schematically illustrating a vertical cross-section of a load lock chamber of the substrate processing apparatus according to the embodiments of the present disclosure.

For example, a boat 32 serving as a substrate support (which is a substrate retainer) capable of supporting the substrate 100 is provided in the load lock chamber 14. As shown in FIG. 3, the boat 32 is provided so as to support the substrates (for example, 10 to 30 substrates) 100 in a multistage manner with a predetermined interval therebetween (specifically, at the predetermined interval in a vertical direction) and so as to accommodate the substrates 100 in a horizontal orientation. Specifically, the boat 32 may be embodied by a structure in which an upper plate 34 and a lower plate 36 are connected by a plurality of support columns (for example, three support columns) 38.

For example, a plurality of support recesses (for example, 10 to 30 support recesses) 40 configured to support the substrates 100 are provided at inner sides of the support columns 38 along a longitudinal direction. Hereinafter, a support recess among the support recesses 40 may also be referred to as a "support recess 40". The support recesses 40 are provided in a parallel manner (that is, parallel to one another) with a predetermined interval therebetween (specifically, at the predetermined interval in the vertical direction). The support recesses 40 of the present embodiments serve as an example of a support structure in the present disclosure. For example, the support recesses 40 may also be referred to as "slots" for the substrates 100. According to the present embodiments, the support structure in the present disclosure may include a structure including the boat 32, the support columns 38 and the support recesses 40. Alternatively, the support structure may include a structure including a combination of the boat 32, the support columns 38 and the support recesses 40. Further, the support structure in the present disclosure may include a mounting table such as a first mounting table 92 described later or a support structure of the mounting table.

For example, the boat 32 may be made of a metal material, preferably a metal material whose thermal conductivity is high (for example, iron, copper and aluminum), or may be made of a material such as silicon carbide and quartz.

A gas supply pipe 42 communicating with an inside of the load lock chamber 14 is connected to a top plate 15A constituting the load lock chamber 14. A gas supply source (not shown) capable of supplying an inert gas (for example, nitrogen gas or a rare gas) and a gas supply valve 43 are sequentially provided at the gas supply pipe 42 in this order from an upstream side toward a downstream side of the gas supply pipe 42 along a gas flow direction.

For example, a cooling structure (not shown) such as a coolant circulation channel is provided at the top plate 15A. The substrate 100 supported by the boat 32 can be cooled by the cooling structure. Specifically, the processed substrate 100 heated after being processed in the process chamber 18 is cooled by the cooling structure.

An exhaust pipe 44 communicating with the inside of the load lock chamber 14 is connected to a bottom plate 15B constituting the load lock chamber 14. A valve 45 and a vacuum pump 46 serving as a vacuum exhaust apparatus are sequentially provided at the exhaust pipe 44 in this order from an upstream side toward a downstream side of the exhaust pipe 44 along the gas flow direction.

According to the present embodiments, the gas supply valve 43 is closed while the communication structures 22 and 26 are closed by the gate valves 24 and 28, respectively. In such a state, when the valve 45 is opened and the vacuum pump 46 is operated, an inner atmosphere of the load lock chamber 14 is vacuum exhausted such that an inner pressure of the load lock chamber 14 can be set (adjusted) to a vacuum pressure (or a decompressed state). In addition, in a state in which the communication structures 22 and 26 are closed by the gate valves 24 and 28, respectively, when the valve 45 is closed (or an opening degree of the valve 45 is reduced) and the gas supply valve 43 is opened to supply the inert gas into the load lock chamber 14, the inner pressure of the load lock chamber 14 can be set to the atmospheric pressure. In a manner described above, the load lock chamber 14 can accommodate the boat 32 to process the substrates 100.

As shown in FIG. 2, an opening 102 is provided on an outer peripheral wall 15C constituting the load lock chamber 14. The substrate 100 can be loaded into or unloaded from the load lock chamber 14 through the opening 102. Specifically, the opening 102 is provided on the outer peripheral wall 15C so as to face the atmospheric robot 30. The atmospheric robot 30 is configured to transfer the substrate 100 to the boat 32 through the opening 102 such that the substrate 100 is supported by the boat 32 and to transfer (take out) the substrate 100 from the boat 32 through the opening 102.

A gate valve 104 capable of opening and closing the opening 102 is provided on the outer peripheral wall 15C.

A window 106 is provided on the outer peripheral wall 15C. For example, the window 106 is made of a material capable of transmitting an infrared light. For example, germanium may be used as the material constituting the window 106.

A temperature sensor 110 is provided on an outer side of the window 106. In other words, the temperature sensor 110 is arranged at an outer side of the load lock chamber 14. The temperature sensor 110 is a sensor capable of measuring a temperature of the substrate 100 supported by the boat 32 in the load lock chamber 14 without contact. That is, the temperature sensor 110 is a non-contact type temperature sensor. Specifically, the temperature sensor 110 measures the temperature of the substrate 100 (that is, the processed substrate 100) supported by the support recess 40 of the boat 32 without contact. For example, the temperature sensor 110 is a radiation thermometer, and measures the temperature of the substrate 100 by measuring an intensity of the infrared light emitted (or radiated) from the substrate 100. More specifically, the temperature sensor 110 measures the temperature of the substrate 100 by measuring the intensity of the infrared light emitted from an outer peripheral surface of the substrate 100 through the window 106. According to the present embodiments, for example, a radiation thermometer (which is a non-contact type temperature sensor) is used as the temperature sensor 110. However, a pyrometer may be used as the temperature sensor 110.

When measuring the temperature of the substrate 100 supported by the boat 32, an elevator 50 is controlled by a controller 120 described later such that the substrate 100 whose temperature is to be measured is located at the same height as a temperature measuring position of the temperature sensor 110 to face the temperature measuring position. The boat 32 can be moved in the vertical direction by the elevator 50. In addition, the boat 32 is configured to be rotatable about an axis extending in the vertical direction by the elevator 50. Specifically, the controller 120 controls the elevator 50 to adjust an elevating position and a rotation angle of the boat 32 such that the substrate 100 (whose temperature is to be measured) supported by the boat 32 is located at the same height as a temperature measuring position of the temperature sensor 110 to face the temperature measuring position.

Further, the temperature sensor 110 is provided at a position at which the temperature of the substrate 100 can be measured. More specifically, by elevating or lowering the boat 32, the temperature sensor 110 can measure temperatures of the substrates 100 including a substrate supported by a lowermost support recess among the support recesses 40 of the boat 32 and a substrate supported by an uppermost support recess among the support recesses 40 of the boat 32. Hereinafter, the lowermost support recess among the support recesses 40 may also be referred to as a "lowermost support recess 40", and the uppermost support recess among the support recesses 40 may also be referred to as an "uppermost support recess 40". For example, according to the present embodiments, as shown in FIG. 3, the temperature sensor 110 is arranged on a lower portion of the outer peripheral wall 15C. Thereby, when the boat 32 is elevated to the highest position, the temperature of the substrate 100 supported by the lowermost support recess 40 can be measured by the temperature sensor 110.

An opening 48 communicating the inside and outside of the load lock chamber 14 is provided at the bottom plate 15B of the load lock chamber 14. The elevator 50 capable of elevating and lowering the boat 32 and rotating the boat 32 through the opening 48 is provided below the load lock chamber 14.

The elevator 50 may include: a shaft 52 serving as a support shaft capable of supporting the boat 32; a bellows (which is extendable and retractable, not shown) provided so as to surround the shaft 52; a fixing base 56 to which lower ends of the shaft 52 and the bellows are fixed; an elevation driver (which is an elevation driving structure) 58 capable of elevating and lowering the boat 32 via the shaft 52; a connection structure 60 capable of connecting the elevation driver 58 and the fixing base 56; and a rotation driver (which is a rotation driving structure) 62 capable of rotating the boat 32.

The elevation driver 58 is configured to elevate or lower the boat 32 along a direction in which the substrates 100 are stacked in the multistage manner.

An upper end of the bellows (not shown) is fixed around the opening 48 provided in the bottom plate 15B constituting the load lock chamber 14.

The rotation driver 62 is configured to rotate the boat 32 about an axis extending along the direction in which the substrates 100 are stacked in the multistage manner. Specifically, the rotation driver 62 rotates the boat 32 around the shaft 52 serving as a rotation axis.

The vacuum robot 70 serving as a vacuum transfer structure is provided in the transfer chamber 16. The vacuum robot 70 is configured to transfer the substrate 100 between the load lock chamber 14 and the process chamber 18. The vacuum robot 70 may include: a substrate transfer structure 72 capable of supporting and transferring the substrate 100; and a transfer driver (which is a transfer driving structure) 74 capable of rotating the substrate transfer structure 72 and elevating or lowering the substrate transfer structure 72.

An arm structure 76 is provided in the substrate transfer structure 72. The arm structure 76 is provided with a finger 78 on which the substrate 100 is placed. Alternatively, a plurality of fingers including the finger 78 may be provided on the arm structure 76 at a predetermined interval therebetween in the vertical direction. For example, a plurality of arm structures including the arm structure 76 may be provided in a multistage manner. In addition, the finger 78 is configured to be extendable and retractable in a substantially horizontal direction.

The substrate 100 can be moved from the load lock chamber 14 to the process chamber 18 by moving the substrate 100 supported by the boat 32 into the transfer chamber 16 by the vacuum robot 70 via the communication structure 22 and further moving the substrate 100 into the process chamber 18 by the vacuum robot 70 via the communication structure 26.

Further, the substrate 100 can be moved from the process chamber 18 to the load lock chamber 14 by moving the substrate 100 in the process chamber 18 into the transfer chamber 16 by the vacuum robot 70 via the communication structure 26 and then supporting the substrate 100 on the boat 32 by the vacuum robot 70 via the communication structure 22.

A first process structure 80, a second process structure 82 located farther from the transfer chamber 16 than the first process structure 80 and a substrate mover (which is a substrate moving structure) 84 capable of transferring the substrate 100 between the second process structure 82 and the vacuum robot 70 are provided in the process chamber 18.

The first process structure 80 may include the first mounting table 92 on which the substrate 100 is placed and a first heater 94 configured to heat the first mounting table 92.

The second process structure 82 may include a second mounting table 96 on which the substrate 100 is placed and a second heater 98 configured to heat the second mounting table 96.

The first process structure 80 and the second process structure 82 are configured to process the substrate 100 likewise (that is, in the same manner).

The substrate mover 84 is constituted by a mover (which is a moving structure) 86 capable of supporting the substrate 100 and a moving shaft 88 provided in the vicinity of the partition wall 20. The mover 86 is provided so as to be rotatable around the moving shaft 88 serving as a rotation axis. Further, the mover 86 can be elevated and lowered around the moving shaft 88.

For example, by rotating the mover 86 toward the first process structure 80, the substrate mover 84 is capable of transferring the substrate 100 to or from the vacuum robot 70 at the first process structure 80. Thereby, the substrate mover 84 is capable of moving the substrate 100 transferred by the vacuum robot 70 to the second mounting table 96 of the second process structure 82 and also capable of moving the substrate 100 placed on the second mounting table 96 to the vacuum robot 70.

Figure 4:
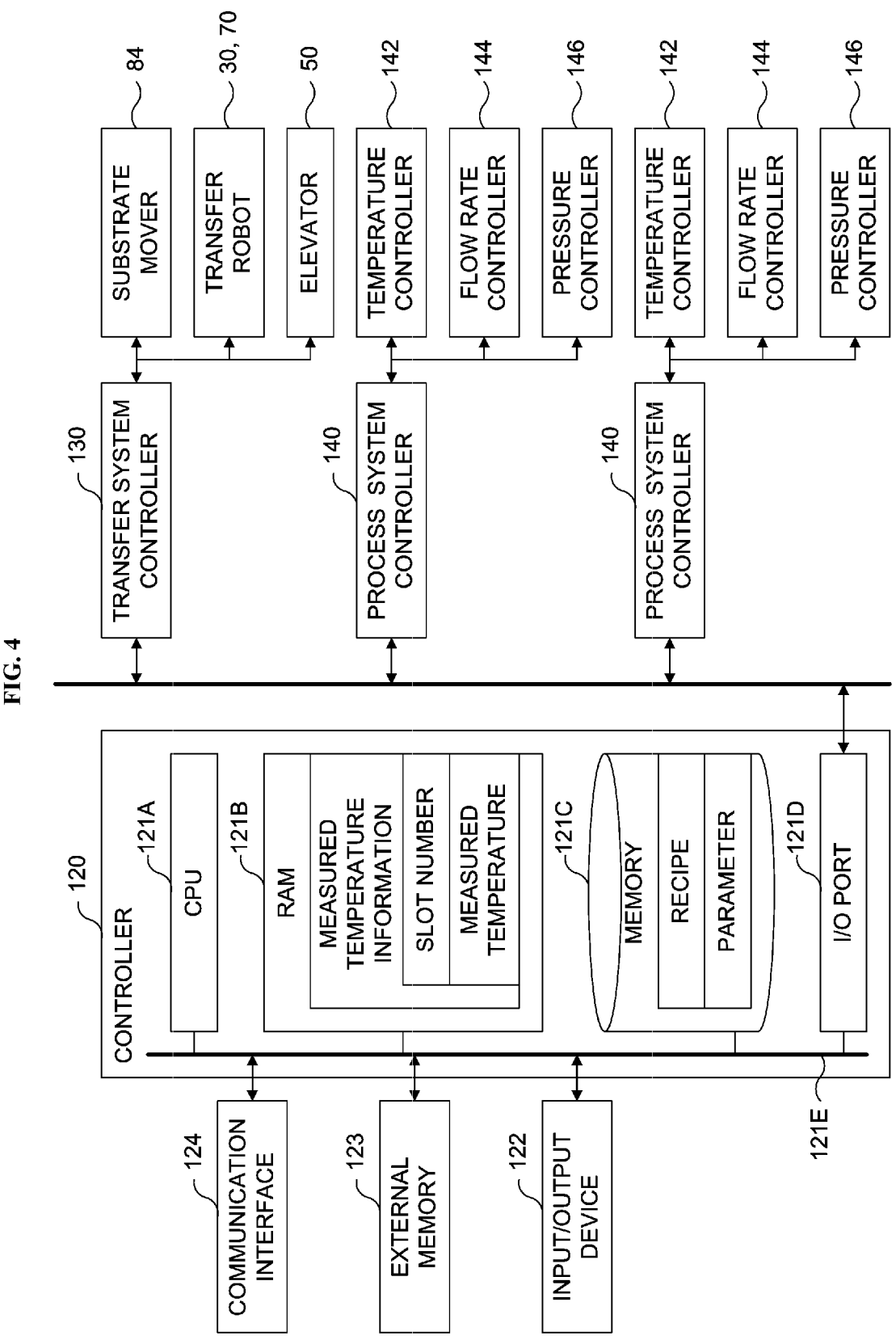
FIG. 4 is a block diagram schematically illustrating an exemplary configuration of a controller and related components of the substrate processing apparatus according to the embodiments of the present disclosure.

As shown in FIG. 4, the substrate processing apparatus 10 includes the controller 120 serving as a control structure. For example, the controller 120 is constituted by a computer including a CPU (Central Processing Unit) 121A, a RAM (Random Access Memory) 121B, a memory 121C and an I/O port (input/output port) 121D.

The RAM 121B, the memory 121C and the I/O port 121D may exchange data with the CPU 121A through an internal bus 121E. For example, an input/output device 122 constituted by components such as a touch panel may be connected to the controller 120. For example, a communication interface 124 capable of communicating with an apparatus such as a host apparatus (not shown) may be connected to the controller 120.

For example, the memory 121C is configured by a component such as a flash memory and a hard disk drive (HDD). For example, a control program configured to control operations of the substrate processing apparatus 10 and a process recipe containing information on sequences and conditions of a substrate processing described later may be readably stored in the memory 121C. The process recipe is obtained by combining steps of the substrate processing described later such that the controller 120 can execute the steps by using the substrate processing apparatus 10 to acquire a predetermined result, and functions as a program. Hereinafter, the process recipe and the control program may be collectively or individually referred to as a "program". Further, the process recipe may also be simply referred to as a "recipe". Thus, in the present specification, the term "program" may refer to the recipe alone, may refer to the control program alone, or may refer to both of the recipe and the control program. The RAM 121B functions as a memory area (work area) where a program or data read by the CPU 121A is temporarily stored. According to the present embodiments, the RAM 121B and the memory 121C may be collectively or individually referred to as a "memory".

The I/O port 121D is connected to components such as a transfer system controller 130 and a plurality of process system controllers 140. Hereinafter, a process system controller among the process system controllers 140 may also be simply referred to as a "process system controller 140". The transfer system controller 130 is a controller capable of controlling a transfer of the substrate 100, and controls components such as the loading port structures 29-1 through 29-3, the atmospheric robot 30, the vacuum robot 70 and the elevator 50.

The process system controller 140 is a controller capable of controlling a processing (that is, the substrate processing) of the substrate 100 in the process chamber 18. According to the present embodiments, for example, when the two process chambers 18A and 18B are provided, two process system controllers 140 are provided in accordance with the two process chambers 18A and 18B. Thereby, it is possible to perform a film-forming process (that is, the substrate processing) independently for each of the process chambers 18A and 18B.

The CPU 121A is configured to read and execute the control program stored in the memory 121C, and to read the recipe stored in the memory 121C in accordance with an instruction such as an operation command inputted via the input/output device 122. For example, in accordance with contents of the read recipe, the CPU 121A is configured to be capable of controlling various operations such as a transfer operation for the substrates 100 by the atmospheric robot 30, the vacuum robot 70, the elevator 50 and the substrate mover 84 and opening and closing operations of the gate valve 24, the gate valve 28 and the gate valve 104.

Further, in accordance with the contents of the read recipe, the CPU 121A is configured to be capable of controlling the process system controller 140 such that the process system controller 140 can control a temperature controller 142, a flow rate controller 144 and a pressure controller 146. The temperature controller 142 is configured to be capable of controlling temperature adjusting operations of the first heater 94 and the second heater 98 (which are capable of heating an inside of the process chamber 18). The flow rate controller 144 is configured to be capable of controlling a flow rate adjusting operation for a gas supplied into the process chamber 18. The pressure controller 146 is configured to be capable of controlling a pressure adjusting operation for adjusting an inner pressure of the process chamber 18.

The controller 120 may be embodied by installing the above-described program stored in an external memory 123 into the computer. For example, the external memory 123 may be constituted by a component such as a magnetic disk such as a hard disk, an optical disk such as a CD, a magneto-optical disk such as an MO and a semiconductor memory such as a USB memory. The memory 121C and the external memory 123 may be embodied by a non-transitory computer readable recording medium. Hereafter, the memory 121C and the external memory 123 may be collectively or individually referred to as a "recording medium". In the present specification, the term "recording medium" may refer to the memory 121C alone, may refer to the external memory 123 alone, and may refer to both of the memory 121C and the external memory 123. Instead of the external memory 123, a communication interface such as the Internet and a dedicated line may be used for providing the program to the computer.

The memory 121C constituting the controller 120 is configured to be capable of storing a recipe including at least one step capable of setting a position of the support recess 40 (which serves as a process condition for the substrate 100) in the boat 32 such that the support recess 40 is located at the same height as the temperature sensor 110 to face the temperature measuring sensor 110. In the present specification, an "identification number" of each of the support recesses 40 indicates the vertical position of each of the support recesses 40 (hereinafter, appropriately referred to as a "support position") arranged in the boat 32 with the predetermined interval therebetween in the vertical direction. For example, according to the present embodiments, the lowermost support recess 40 among the support recesses 40 may also be referred to as a "first stage support recess 40" or a "first support recess 40". In addition, the controller 120 is configured to be capable of controlling an operation of elevating and lowering the boat 32 (hereinafter, also simply referred to as an "elevation operation of the boat 32") such that the position (support position) of the support recess 40 (which is set in the process conditions) is located at a predetermined reference position during the substrate 100 being processed in accordance with the recipe. Specifically, while the substrate 100 is being processed in accordance with the recipe, the controller 120 is configured to be capable of controlling the elevation operation of the boat 32 such that the position (indicated by its identification number) of the support recess 40 (which is set in the process conditions) is located at the reference position, i.e., at the same height as the temperature measuring position of the temperature sensor 110 to face the temperature measuring position. In the present specification, the temperature measuring position of the temperature sensor 110 refers to a vertical position from which the infrared light is emitted by the temperature sensor 110. The controller 120 also controls the elevator 50 to elevate and lower the boat 32.

Further, as shown in FIG. 5, the elevation operation of the boat 32 during each step of the recipe being performed can be designated by a control mode determined for each step. As shown in FIG. 6, the control mode may include at least one selected from the group consisting of an elevation mode in which the elevation operation of the boat 32 can be controlled, a temperature measuring mode in which an operation of measuring the temperature of the substrate 100 supported by the support recess 40 (hereinafter, also simply referred to as a "temperature measuring operation") can be performed and a temperature monitoring mode in which an operation of monitoring the temperature of the substrate 100 supported by the support recess 40 set in accordance with the process conditions of the substrate 100 (hereinafter, also referred to as a "temperature monitoring operation") can be continuously performed. The present embodiments will be described by way of an example in which the control mode includes the elevation mode, the temperature measuring mode and the temperature monitoring mode. However, the technique of the present disclosure is not limited thereto.

In the elevation mode, the position of the support recess 40 can be designated. Then, the elevation operation of the boat 32 is performed (that is, the boat 32 is elevated or lowered) such that the position of the support recess 40 designated in a manner described above is located at the same height as the temperature measuring position of the temperature sensor 110 to face the temperature measuring position. Specifically, the controller 120 controls the elevator 50 to elevate or lower the boat 32 such that the support recess 40 whose identification number is designated as described above moves to the temperature measuring position of the temperature sensor 110. Further, in the elevation mode, the elevation operation of the boat 32 can be controlled such that the support recess 40 whose identification number is designated as described above moves to the temperature measuring position in the shortest time.

In the temperature measuring mode, positions of all the support recesses 40 or the position of a specific support recess 40 can be designated. The controller 120 controls the elevator 50 to elevate or lower the boat 32 such that the support recess 40 whose identification number is designated as described above moves to the temperature measuring position of the temperature sensor 110. Then, the temperature sensor 110 is capable of measuring the temperature of the substrate 100 supported by the support recess 40, whose identification number is designated as described above, at the temperature measuring position.

In the temperature measuring mode, when the positions (identification numbers) of all the support recesses 40 are designated, in order to measure the temperatures of the substrates 100, the elevation operation of the boat 32 and the temperature measuring operation of measuring the temperature of each of the substrates 100 are repeatedly performed for the position (indicated by its identification number) of each of the substrates 100 to be located at the same height as the temperature measuring position of the temperature sensor 110 to face the temperature measuring position.

Figure 7:
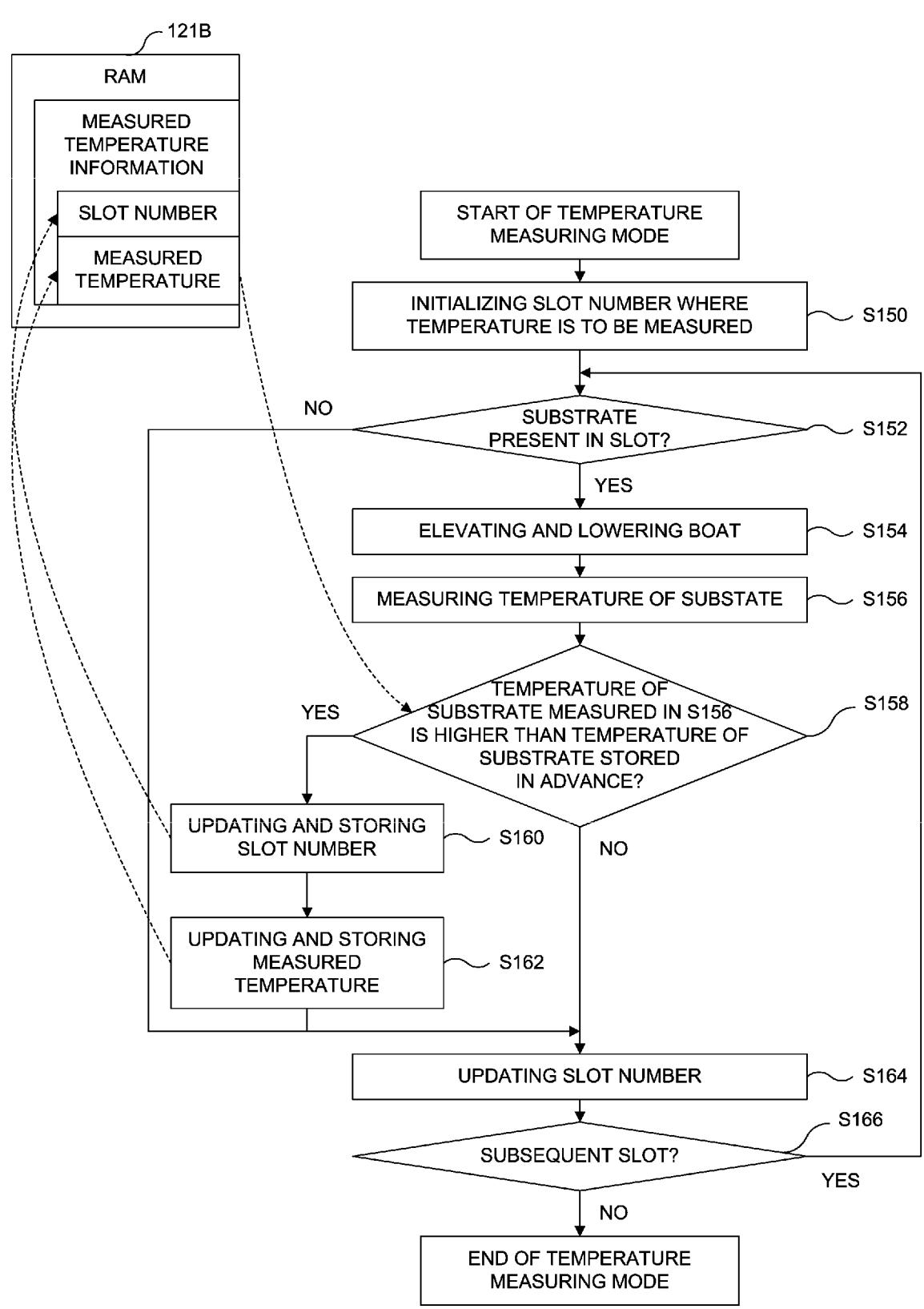
FIG. 7 is a flow chart schematically illustrating a flow of a temperature measuring mode of the substrate processing apparatus according to the embodiments of the present disclosure.

For example, as shown in FIG. 7, when the positions (identification numbers) of all the support recesses 40 are designated in the temperature measuring mode, the controller 120 stores the identification number of the support recess 40 of the highest temperature in the RAM 121B.

For example, in a case where the positions (identification numbers) of all the support recesses 40 are designated in the temperature measuring mode and there is a support recess (among the support recesses 40) where no substrate (among the substrates 100) is supported, the controller 120 is configured to be capable of skipping the support recess where no substrate is supported. It is possible to determine a presence or absence of the support recess where no substrate is supported based on position information when the substrates 100 are supported by the boat 32. For example, the position information is stored in the memory 121C.

In the temperature monitoring mode, the boat 32 is elevated or lowered such that the position (indicated by its identification number) of the support recess 40 stored in the RAM 121B in the temperature measuring mode moves to the temperature measuring position of the temperature sensor 110. Then, as shown in FIG. 8, the temperature of the substrate 100 supported by the support recess 40 at the temperature measuring position can be monitored by the temperature sensor 110.

For example, in the temperature monitoring mode, a threshold for the temperature of the substrate 100 can be set. In the temperature monitoring mode, when a temperature measurement result for the substrate 100 by the temperature sensor 110 is lower than the threshold, a subsequent step can be performed.

For example, in the temperature monitoring mode, a temperature monitoring time (i.e., time duration of temperature monitoring) can be set. When the temperature monitoring operation of monitoring the temperature of the substrate 100 supported by the support recess 40 (which is performed by the temperature sensor 110) is performed longer than the temperature monitoring time, as shown in FIG. 8, a time lapse process set in the step can be performed.

Figure 9:
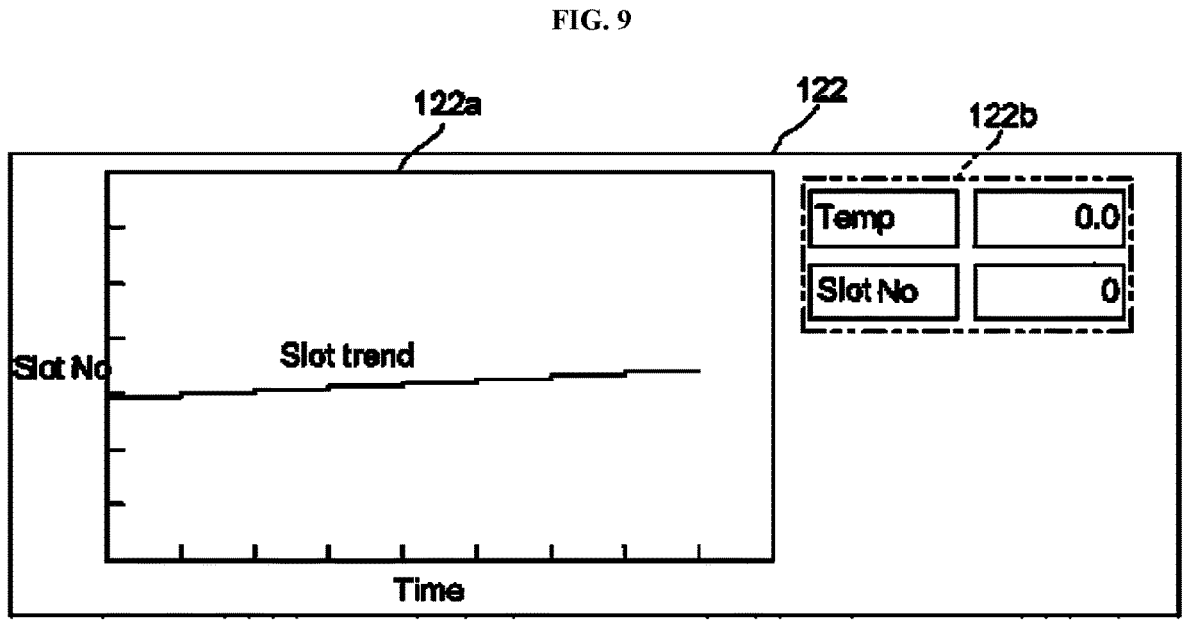
FIG. 9 is a diagram schematically illustrating a display of the substrate processing apparatus according to the embodiments of the present disclosure.

As shown in FIG. 9, the input/output device 122 may include a display 122a capable of displaying a processing status of the substrate 100. The display 122a is capable of displaying on a monitor the temperature measurement result for the substrate 100 supported by the support recess 40 whose identification number is designated as described above (which is designated in the temperature measuring mode or the temperature monitoring mode). For example, the display 122a is capable of graphically displaying, in real time or as historical information, the temperature measurement result for the substrate 100 supported by the support recess 40 whose identification number is designated as described above (which is designated in the temperature measuring mode or the temperature monitoring mode). The input/output device 122 may also include an operation controller 122b. By operating the operation controller 122b, it is possible to designate the substrate 100 supported by the support recess 40 and to check temperature information thereof.

<Method of Manufacturing Semiconductor Device>

Subsequently, a method of manufacturing the semiconductor device by using the substrate processing apparatus 10, that is, process sequences of the substrate processing of processing the substrate 100 will be described. In the following description, as described above, operations of components constituting the substrate processing apparatus 10 are controlled by the controller 120.

First, the substrates 100 stored in the pods 27-1 through 27-3 are transferred into the atmospheric transfer chamber 12 by the atmospheric robot 30.

Subsequently, after setting (adjusting) the inner pressure of the load lock chamber 14 to the atmospheric pressure, the gate valve 104 is opened. Specifically, the gas supply valve 43 of the gas supply pipe 42 is opened to supply the inert gas into the load lock chamber 14. After setting the inner pressure of the load lock chamber 14 to the atmospheric pressure in a manner described above, the gate valve 104 is opened.

Subsequently, the substrate 100 is transferred (loaded) into the load lock chamber 14. Specifically, the substrate 100 loaded into the atmospheric transfer chamber 12 is transferred into the load lock chamber 14 by the atmospheric robot 30, and is placed on the support recess 40 of the boat 32. Thereby, the substrate 100 is supported by the boat 32.

Subsequently, after the gate valve 104 is closed, the inner pressure of the load lock chamber 14 is set to the vacuum pressure. Specifically, after a predetermined number of the substrates 100 are supported by the boat 32, the valve 45 of the exhaust pipe 44 is opened so as to exhaust the inside of the load lock chamber 14 by the vacuum pump 46. Thereby, it is possible to set the inner pressure of the load lock chamber 14 to the vacuum pressure. Further, when setting the inner pressure of the load lock chamber 14 to the vacuum pressure, an inner pressure of the transfer chamber 16 and the inner pressure of the process chamber 18 are also set to the vacuum pressure.

Subsequently, the substrate 100 is transferred from the load lock chamber 14 to the process chamber 18. Specifically, first, the gate valve 24 is opened. When opening the gate valve 24, the elevation driver 58 can elevate or lower the boat 32 such that the substrate 100 supported by the boat 32 is capable of being transferred (or taken out) by the vacuum robot 70. Further, the rotation driver 62 can rotate the boat 32 such that a substrate loading/unloading port of the boat 32 faces the transfer chamber 16.

The vacuum robot 70 extends the finger 78 of the arm structure 76 toward the boat 32 and places the substrate 100 on the finger 78. After retracting the finger 78, the vacuum robot 70 rotates the arm structure 76 such that the arm structure 76 faces the process chamber 18. Subsequently, the vacuum robot 70 extends the finger 78 such that the substrate 100 is loaded into the process chamber 18 through the communication structure 26 with the gate valve 28 opened.

In the process chamber 18, the substrate 100 placed on the finger 78 may be placed on the first mounting table 92 of the first process structure 80, or may be transferred to the mover 86 standing by on a side portion of the first process structure 80. After receiving the substrate 100, the mover 86 is rotated toward the second process structure 82 and places the substrate 100 on the second mounting table 96.

Then, in the process chamber 18, the substrate 100 is subjected to a predetermined process such as an ashing process. In the predetermined process, the temperature of the substrate 100 is elevated by being heated by a heater such as the first heater 94 and the second heater 98, or by being heated by a reaction heat generated by performing the predetermined process.

Subsequently, the substrate 100 after the predetermined process is performed (that is, the processed substrate 100) is transferred from the process chamber 18 to the load lock chamber 14. A transfer of the substrate 100 from the process chamber 18 to the load lock chamber 14 is performed in an order reverse to that of loading the substrate 100 into the process chamber 18 described above. When transferring the substrate 100 from the process chamber 18 to the load lock chamber 14, the inside of the load lock chamber 14 is maintained in a vacuum state (that is, the inner pressure of the load lock chamber 14 is set to the vacuum pressure).

After the processed substrates 100 are loaded into the load lock chamber 14 and supported by the boat 32 in the multistage manner with the predetermined interval therebetween, the gate valve 24 is closed and the inner pressure of the load lock chamber 14 is set to the atmospheric pressure. Specifically, the gas supply valve 43 of the gas supply pipe 42 is opened to supply the inert gas into the load lock chamber 14. Thereby, the inner pressure of the load lock chamber 14 is set to the atmospheric pressure by supplying the inert gas. According to the present embodiments, the boat 32 and the substrates 100 supported by the boat 32 are cooled by the cooling structure (not shown) and the inert gas supplied into the load lock chamber 14. A cooling operation for the substrate 100 in the load lock chamber 14 is performed for a predetermined time. In addition, the inert gas supplied into the load lock chamber 14 may be cooled in advance in a location preceding the gas supply pipe 42 in order to promote the cooling operation.

Further, when the processed substrates 100 are completely loaded (placed) into the boat 32, the boat 32 is elevated or lowered to a position for cooling the processed substrates 100. According to the present embodiments, the cooling operation is performed while the boat 32 is elevated to the highest position such that the cooling by the cooling structure can be promoted.

Subsequently, after the substrate 100 is cooled for the predetermined time, as shown in FIG. 7, the controller 120 starts measuring a maximum temperature of the substrates 100 by the temperature sensor 110. First, the identification number (hereinafter, appropriately referred to as a "slot number" or a "slot position") of the support recess 40 whose temperature is to be measured is initialized (step S150).

Subsequently, it is determined whether or not the substrate 100 is present in the first (lowermost) support recess 40 (hereinafter, appropriately referred to as a "slot") (step S152). When the substrate 100 is present in the first support recess 40, a step S154 is performed. When the substrate 100 is not present in the first support recess 40, a step S164 is performed.

In the step S154, the boat 32 is elevated or lowered such that the support recess 40 with a specified identification number (which is determined that the substrate 100 is present in the first support recess 40 in the step S152) moves to the temperature measuring position of the temperature sensor 110. According to the present embodiments, for example, the boat 32 is lowered such that the slot position of the support recess 40 is located at the same height as the temperature measuring position to face the temperature measuring position.

Subsequently, in a step S156, the temperature of the substrate 100 supported by the support recess 40 is measured by the temperature sensor 110.

Subsequently, in a step S158, the temperature of the substrate 100 measured in the step S156 is compared with a substrate temperature stored in the RAM 121B serving as a temporary memory. When the temperature of the substrate 100 measured in the step S156 is higher than the substrate temperature stored in the RAM 121B, a step S160 is performed. On the other hand, when the temperature of the substrate 100 measured in the step S156 is equal to or lower than the substrate temperature stored in the RAM 121B, the step S164 is performed.

In the step S160, a slot number stored in the RAM 121B is updated to the slot number corresponding to the substrate 100 whose temperature is measured in the step S156 and stored in the RAM 121B.

Subsequently, in a step S162, a measured temperature stored in the RAM 121B is updated and stored in association with the slot number updated in the step S160.

In the step S164, the slot number is updated.

Subsequently, in a step S166, it is determined whether or not there is a subsequent slot. When there is the subsequent slot, the step S152 is performed again so as to measure the temperature of the substrate 100 supported by the subsequent slot (that is, a subsequent support recess among the support recesses 40). On the other hand, when there is no subsequent slot, the temperature measuring operation for the substrate 100 is terminated. According to the present embodiments, in a case where the substrates 100 are supported by the entirety of the slots, respectively, the temperature measuring operation for the substrate 100 is continued until the temperatures of the substrates 100 supported by the entirety of the slots are completely measured.

When the temperatures of all the substrates 100 supported by the slots are completely measured, the temperature measuring mode is switched to the temperature monitoring mode, and the temperature monitoring operation is started.

In a step S170, the temperature monitoring time is set and a time monitoring operation is started. For example, the temperature monitoring time is acquired from information stored in the memory 121C.

Subsequently, in a step S172, the slot number of the slot supporting the substrate 100 whose temperature is to be monitored is obtained from the slot number stored in the RAM 121B. For example, in the temperature monitoring mode, the slot number stored in the RAM 121B is the slot number of the slot supporting the substrate 100 with the highest temperature stored in the temperature measuring mode.

Subsequently, in a step S174, the boat 32 is elevated or lowered in the vertical direction such that the slot with the slot number acquired in the step S172 corresponds to the temperature measuring position of the temperature sensor 110.

Subsequently, in a step S176, the temperature of the substrate 100 supported by the slot whose slot number is acquired in the step S172 is measured by the temperature sensor 110.

In a step S178, it is determined whether or not the temperature measured in the step S176 is lower than the threshold (temperature) stored in the memory unit 121C. When the temperature measured in the step S176 is lower than the threshold stored in the memory 121C, a step S180 is performed. On the other hand, when the temperature measured in the step S176 is equal to or higher than the threshold stored in the memory 121C, a step S182 is performed.

In the step S180, the time monitoring operation is terminated. Thereby, the temperature monitoring operation is terminated. That is, the temperature monitoring mode is terminated.

In the step S182, it is determined whether or not the temperature monitoring time set in the step S170 has elapsed. When the temperature monitoring time set in the step S170 has not elapsed, the step S176 is performed again. When returning from the step S182 to the step S176, it is preferable to return to the step S176 after a predetermined period of time has elapsed. For example, the step S176 may be returned from the step S182 after one second has elapsed. On the other hand, when the temperature monitoring time set in the step S170 has elapsed, a step S184 is performed.

Further, it is preferable that the inert gas is continuously supplied through the gas supply pipe 42 at least until it is determined in the step S182 that the substrate 100 to be monitored has been sufficiently cooled. In such a case, the valve 45 of the exhaust pipe 44 is opened with a small degree of opening, and the load lock chamber 14 is continuously exhausted by the vacuum pump 46 such that the inner pressure of the load lock chamber 14 is maintained at a constant pressure.

In the step S184, it is determined whether or not there is a process (that is, the time lapse process) to be performed when the temperature monitoring time has elapsed. When there is such process to be performed, a step S186 is performed. On the other hand, when there is no such process to be performed, the temperature monitoring operation is terminated. That is, the temperature monitoring mode is terminated.

In the step S186, the time lapse process ("ACTION" shown in FIG. 6) set in advance is performed. For example, the time lapse process includes a transition to a subsequent step, a termination of the recipe and the like. After performing the time lapse process, the temperature monitoring operation is terminated. That is, the temperature monitoring mode is terminated.

After the temperature monitoring mode is terminated, the substrate 100 (which is cooled in a manner described above) is unloaded from the load lock chamber 14 to the atmospheric transfer chamber 12. Specifically, the substrate 100 is transferred from the load lock chamber 14 with the gate valve 104 open to the atmospheric transfer chamber 12 by using the atmospheric robot 30. Thereby, the transfer operation of the substrate 100 is completed. Further, by transferring the substrate 100 (which is cooled) to the atmospheric transfer chamber 12, the semiconductor device is manufactured on the substrate 100.

Subsequently, operations and effects according to the present embodiments will be described. When the temperature of the substrate 100 unloaded from the load lock chamber 14 fluctuates, the substrate 100 at a high temperature may react with an atmosphere at a low temperature, causing an undesirable oxidation or damaging the semiconductor device or components. Therefore, it is preferable to recognize the temperature of the processed substrate 100 in the load lock chamber 14.

According to the present embodiments, the controller 120 controls the elevation operation of the boat 32 such that the position of the support recess 40 (which is set in the process conditions) is located at the predetermined reference position while the substrate 100 is being processed in accordance with the recipe. Therefore, it is possible to set an optimum position (of the substrate 100) that matches the process conditions for each step. Specifically, the controller 120 controls the elevation operation of the boat 32 such that the position of the support recess 40 (which is set in the process conditions) is located at the same height as the temperature measuring position of the temperature sensor 110 to face the temperature measuring position, thereby making it possible to measure the temperature of the substrate 100 on a substrate-by-substrate basis. According to the present embodiments described above, as compared with a conventional method of measuring an estimated temperature of the substrate 100 to be measured by measuring a temperature of an area in which the substrate 100 to be measured is located, it is possible to substantially uniformize a quality of each substrate 100 by performing the substrate processing at the optimum position. That is, it is possible to suppress variations in the temperature of the substrate 100 unloaded from the load lock chamber 14, and it is also possible to reduce undesired effects of the variations in the temperature (such as variation in a degree of oxidation). By substantially uniformizing the quality of each substrate 100 in a manner described above, it is possible to shorten a process time in a target step. Thereby, it is possible to contribute to an improvement of a production efficiency of the substrate 100.

According to the present embodiments, for example, the elevation operation of the boat 32 during each step of the recipe being performed can be designated by the control mode determined for each step. By controlling the elevation operation of the boat 32 in accordance with process contents of the step as described above, it is possible to substantially uniformize the quality of each substrate 100. In addition, it is possible to prevent an occurrence of a defective substrate.

According to the present embodiments, for example, the control mode includes at least one selected from the group consisting of the elevation mode of the boat 32, the temperature measuring mode in which the temperature of the substrate 100 is measured and the temperature monitoring mode in which the temperature of the substrate 100 designated as described above is monitored. By setting a plurality of modes for controlling the boat 32 as described above, it is possible to efficiently perform the substrate processing. Thereby, it is possible to contribute to the improvement of the production efficiency of the substrate 100.

According to the present embodiments, for example, the boat 32 is elevated or lowered in the elevation mode such that the position (indicated by its slot number) of the support recess 40 can be designated in the elevation mode and such that the position of the support recess 40 designated as described above is located at the reference position, i.e., at the same height as the temperature measuring position of the temperature sensor 110 to face the temperature measuring position. By adjusting the slot position according to the process contents of the step as described above, it is possible to adjust a process gas to uniformly flow to the substrate 100, and it is also possible to substantially uniformize the quality of each substrate 100.

According to the present embodiments, for example, the elevation operation of the boat 32 can be controlled in the elevation mode such that the support recess 40 whose position (indicated by its slot number) is designated as described above moves to the temperature measuring position (which faces reference position at the same height) in the shortest time. As a result, it is possible to shorten a moving time of the boat 32. Thereby, it is possible to contribute to the improvement of the production efficiency of the substrate 100.

According to the present embodiments, for example, the positions (indicated by their slot numbers) of all the support recesses 40 or the position (slot number) of the specific support recess 40 can be designated in the temperature measuring mode. Further, the boat 32 is elevated or lowed such that the support recess 40 whose position (slot number) is designated as described above moves to the temperature measuring position of the temperature sensor 110. Then, the temperature sensor 110 measures the temperature of the substrate 100 supported by the support recess 40 at the temperature measuring position. Since the temperature of the substrate 100 supported by the support recess 40 whose position (slot number) is designated as described above can be measured, it is possible to accurately obtain the temperature of the substrate 100.

According to the present embodiments, for example, when the positions (indicated by their slot numbers) of all the support recesses 40 are designated in the temperature measuring mode, the elevation operation of the boat 32 and the temperature measuring operation for each of the substrates 100 by the temperature sensor 110 are repeatedly performed so that the position (indicated by its slot number) of each of the support recesses 40 is located at the reference position, i.e., at the same height as the temperature measuring position of the temperature sensor 110 to face the temperature measuring position. Therefore, it is possible to measure the temperatures of all the substrates 100 supported by the boat 32. It is also possible to accurately obtain the temperatures of the substrates 100.

According to the present embodiments, for example, when the positions (indicated by their slot numbers) of all the support recesses 40 are designated in the temperature measuring mode, the controller 120 stores the position (indicated by its slot number) of the support recess 40 that supports the substrate 100 of the highest temperature in the memory 121C. Therefore, it is possible to which of the support recesses 40 supports the substrate 100 of the highest temperature, and it is also possible to perform the substrate processing by considering the substrate 100 of the highest temperature supported by the support recess 40 in another step. Thereby, it is possible to substantially uniformize the quality of each substrate 100.

According to the present embodiments, for example, in the case where the positions (slot numbers) of all the support recesses 40 are designated in the temperature measuring mode and there is a support recess (among the support recesses 40) where no substrate (among the substrates 100) is supported, the controller 120 is configured to be capable of skipping the support recess where no substrate is supported. Therefore, it is possible to shorten a time for performing the elevation operation of the boat 32 and a time for performing the temperature measuring operation by the temperature sensor 110. Thereby, it is possible to contribute to the improvement of the production efficiency of the substrate 100.

According to the present embodiments, for example, the boat 32 is elevated or lowered in the temperature monitoring mode such that the position (slot number) of the support recess 40 stored in the RAM 121B in the temperature measuring mode moves to the temperature measuring position (which faces reference position at the same height) of the temperature sensor 110. Then, the temperature of the substrate 100 supported by the support recess 40 at the temperature measuring position can be monitored by the temperature sensor 110. Therefore, instead of monitoring the temperature of the support recess 40 whose position is fixed, by automatically setting the support recess 40 that supports the substrate 100 to be monitored, it is possible to avoid an erroneous setting.

According to the present embodiments, for example, the threshold for the temperature of the substrate 100 can be set in the temperature monitoring mode. Further, when the temperature measurement result for the substrate 100 by the temperature sensor 110 is higher or lower than the threshold, the subsequent step can be performed. Thereby, since it is possible to move on to a subsequent action when the temperature measurement result for the substrate 100 reaches a monitoring temperature, the substrate processing can be performed without wasting a remaining time of the step. It is also possible to contribute to a shortening of the process time and the improvement of the production efficiency.

According to the present embodiments, for example, the temperature monitoring time of the substrate 100 can be set in the temperature monitoring mode. When the temperature monitoring operation (which is performed by the temperature sensor 110) for the substrate 100 supported by the support recess 40 is performed longer than the temperature monitoring time, the time lapse process set in the step can be performed. By providing the temperature monitoring time for monitoring the temperature of the substrate 100 as described above, it is possible to terminate the subsequent step or the recipe before the temperature of the substrate 100 exceeds the threshold.

According to the present embodiments, for example, the input/output device 122 includes the display 122a capable of displaying the processing status of the substrate 100. The display 122a is capable of displaying the temperature measurement result for the substrate 100 supported by the support recess 40 whose position (indicated by its slot number) is designated in the temperature measuring mode or the temperature monitoring mode. Therefore, by checking the temperature of the specific support recess 40 while the recipe is being performed, it is possible to deal with a case where the temperature of the substrate 100 becomes abnormal, and it is also possible to suppress the occurrence of the defective substrate.

According to the present embodiments, for example, the display 122a is capable of graphically displaying, in real time or as historical information, the temperature measurement result for the substrate 100 supported by the support recess 40 (whose position (slot number) is designated in the temperature measuring mode or the temperature monitoring mode). Therefore, by visualizing a temperature change on the substrate 100 designated as described above, it is possible to contribute to a better adjustment of a product recipe.

<Other Embodiments of Present Disclosure>

While the technique of the present disclosure is described in detail by way of the embodiments described above, the technique of the present disclosure is not limited thereto. The technique of the present disclosure may be modified in various ways without departing from the scope thereof. For example, the embodiments described above are described by way of an example in which the temperature sensor 110 is arranged on the lower portion of the outer peripheral wall 15C of the load lock chamber 14. However, the technique of the present disclosure is not limited thereto. For example, the temperature sensor 110 may be provided at any position in the load lock chamber 14 as long as the temperatures of all of the substrates 100 supported by the boat 32 can be measured by the temperature sensor 110. In addition, the window 106 is provided at a portion of the outer peripheral wall 15C where the temperature sensor 110 is provided.

For example, the embodiments described above are described by way of an example in which the cooling operation of the substrate 100 in the load lock chamber 14 is performed for a predetermined time and then the temperature measuring operation of the substrate 100 by the temperature sensor 110 is performed. However, the technique of the present disclosure is not limited thereto. For example, after the substrate 100 is transferred into the load lock chamber 14, the temperature of the substrate 100 may be measured by the temperature sensor 110 before the substrate 100 is cooled.

For example, the embodiments described above are described by way of an example in which the temperature sensor 110 is arranged at the outer side of the load lock chamber 14. However, the technique of the present disclosure is not limited thereto. For example, the temperature sensor 110 may be arranged at an inner side of the load lock chamber 14.

For example, the embodiments described above are described by way of an example in which, when the temperature of the substrate 100 (among the substrates 100 supported by the boat 32 in the load lock chamber 14) with the highest temperature is lower than the threshold, it is determined that the substrate 100 has been sufficiently cooled and the substrate 100 is unloaded from the load lock chamber 14. However, the technique of the present disclosure is not limited thereto. For example, the technique of the present disclosure may also be applied in a case where the substrate 100 whose temperature is the highest among the substrates 100 supported by the boat 32 serving as the substrate support in the process chamber 18 (in which a heat treatment is performed on the substrates 100) is obtained in the temperature measuring mode, the temperature of the substrate 100 whose temperature is the highest is monitored and the heat treatment is terminated before the temperature of the substrate 100 whose temperature is the highest exceeds (that is, is higher than) a threshold. By terminating the heat treatment before the temperature of the substrate 100 exceeds the threshold, as compared with a case where the temperature of the substrate 100 exceeds the threshold, it is possible to perform a subsequent step while maintaining a normal state (steady state) of the substrate 100 before exceeding the threshold. It is also possible to prevent the occurrence of an abnormal substrate (that is, the defective substrate).

According to some embodiments of the present disclosure, it is possible to substantially uniformize the quality of each substrate by setting the position of the substrate in accordance with the process conditions for each step of the substrate processing.

What is claimed is:

1. A substrate processing apparatus comprising:
   a support structure capable of supporting at least a substrate;
   a temperature sensor capable of measuring a temperate of the substrate; and
   a controller provided with a memory in which a recipe capable of setting a support position of the substrate is stored,
   wherein the controller is configured to be capable of controlling an operation of elevating and lowering the support structure such that the support position set in the recipe is located at a predetermined reference position, and
   wherein the controller is further configured to be capable of controlling the operation of elevating and lowering the support structure such that the support position faces a same height as a temperature measuring position of the temperature sensor that indicates the reference position.

2. The substrate processing apparatus of claim 1, wherein the recipe comprises at least a step, and the support position is set in the step.

3. The substrate processing apparatus of claim 1, wherein the operation of elevating and lowering the support structure during the recipe being performed is designated by a control mode determined by the recipe.

4. The substrate processing apparatus of claim 3,
wherein the control mode comprises at least one selected from the group consisting of an elevation mode in which the operation of elevating and lowering the support structure is capable of being controlled, a temperature measuring mode in which an operation of measuring the temperature of the substrate is capable of being performed and a temperature monitoring mode in which an operation of monitoring the temperature of the substrate is capable of being continuously performed in accordance with conditions set in advance.

5. The substrate processing apparatus of claim 4, wherein, in the elevation mode, the support position is capable of being designated, and
wherein the controller is configured to be capable of controlling the operation of elevating and lowering the support structure such that the support position designated in the elevation mode is located at the reference position.

6. The substrate processing apparatus of claim 5, wherein, in the elevation mode, the controller is configured to be capable of controlling the operation of elevating and lowering the support structure such that the support position designated in the elevation mode moves to the reference position in a shortest time.

7. The substrate processing apparatus of claim 4, wherein, in the temperature measuring mode, the support position is capable of being designated among a plurality of support positions, and
wherein the controller is configured to be capable of controlling the operation of elevating and lowering the support structure such that the support position designated in the temperature measuring mode is located at the reference position and capable of performing the operation of measuring the temperature of the substrate for the temperature sensor to perform a temperature detection in a state where the support position of the substrate is located at the reference position.

8. The substrate processing apparatus of claim 4, wherein, in a case where each of a plurality of support positions is designated in the temperature measuring mode, the operation of elevating and lowering the support structure and the operation of measuring the temperature of the substrate are repeatedly performed so that each of the plurality of support positions is located at the reference position.

9. The substrate processing apparatus of claim 4, wherein, in a case where each of a plurality of support positions is designated in the temperature measuring mode, a support position whose temperature is highest among the plurality of support positions is stored in the memory in the temperature measuring mode.

10. The substrate processing apparatus of claim 9, wherein in the temperature monitoring mode, the controller is configured to be capable of controlling the operation of elevating and lowering the support structure such that the support position stored in the memory in the temperature measuring mode moves to the reference position and performing the operation of monitoring the temperature of the substrate by using the temperature sensor in a state where the support position of the substrate is located at the reference position.

11. The substrate processing apparatus of claim 10, wherein
the operation of monitoring the temperature of the substrate is terminated in a case where a temperature measurement result for the substrate obtained by the temperature sensor is lower than a threshold stored in the memory.

12. The substrate processing apparatus of claim 10, wherein,
a time lapse process set by the recipe is performed in a case where the operation of monitoring the temperature of the substrate is performed longer than a temperature monitoring time acquired from information stored in the memory.

13. The substrate processing apparatus of claim 4, wherein, in a case where each of a plurality of support positions is designated in the temperature measuring mode and there is a support position where no substrate is supported, the support position where no substrate is supported is skipped.

14. The substrate processing apparatus of claim 4, further comprising:
a display capable of displaying a processing status of the substrate,
wherein the display is capable of displaying on a monitor a temperature measurement result for the substrate whose support position is designated in the temperature measuring mode or the temperature monitoring mode.

15. The substrate processing apparatus of claim 14, wherein the display is capable of graphically displaying, in real time or as historical information, the temperature measurement result for the substrate whose support position is designated in the temperature measuring mode or the temperature monitoring mode.

16. A method of manufacturing a semiconductor device, comprising:
(a) performing a recipe capable of setting a support position of a substrate in a support structure capable of supporting the substrate; and
(b) elevating and lowering the support structure such that the support position set in (a) is located at a predetermined reference position,
wherein the reference position indicates a temperature measuring position of a temperature sensor capable of measuring a temperature of the substrate, and
wherein, in (b), the support structure is elevated and lowered such that the support position faces the reference position at a same height.

17. A non-transitory computer-readable recording medium storing a program that causes a substrate processing apparatus, by a computer, to perform:
(a) performing a recipe capable of setting a support position of a substrate in a support structure capable of supporting the substrate; and
(b) elevating and lowering the support structure such that the support position set in (a) is located at a predetermined reference position,
wherein the reference position indicates a temperature measuring position of a temperature sensor capable of measuring a temperature of the substrate, and wherein, in (b), the support structure is elevated and lowered such that the support position faces the reference position at a same height.

\* \* \* \* \*